(12) United States Patent
Wu et al.

(10) Patent No.: US 9,087,720 B1
(45) Date of Patent: Jul. 21, 2015

(54) METHODS FOR FORMING FINFETS WITH REDUCED SERIES RESISTANCE

(71) Applicant: GLOBALFOUNDRIES Inc., Grand Cayman (KY)

(72) Inventors: Xusheng Wu, Ballston Lake, NY (US); Changyong Xiao, Mechanicville, NY (US); Manfred Eller, Beacon, NY (US); Wanxun He, Mechanicville, NY (US); Jie Chen, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/450,535

(22) Filed: Aug. 4, 2014

(51) Int. Cl.
| | |
|---|---|
| H01L 21/336 | (2006.01) |
| H01L 21/8234 | (2006.01) |
| H01L 27/088 | (2006.01) |
| H01L 27/12 | (2006.01) |
| H01L 21/84 | (2006.01) |
| H01L 29/66 | (2006.01) |
| H01L 21/02 | (2006.01) |
| H01L 21/265 | (2006.01) |
| H01L 29/78 | (2006.01) |

(52) U.S. Cl.
CPC ...... *H01L 27/0886* (2013.01); *H01L 21/02576* (2013.01); *H01L 21/02579* (2013.01); *H01L 21/26513* (2013.01); *H01L 21/823431* (2013.01); *H01L 21/845* (2013.01); *H01L 27/1211* (2013.01); *H01L 29/6656* (2013.01); *H01L 29/66575* (2013.01); *H01L 29/7833* (2013.01)

(58) Field of Classification Search
USPC .......................................................... 438/197
See application file for complete search history.

(56) References Cited

U.S. PATENT DOCUMENTS

| | | | |
|---|---|---|---|
| 7,074,656 B2 | 7/2006 | Yeo et al. | |
| 7,087,471 B2 | 8/2006 | Beintner | |
| 8,735,303 B2 | 5/2014 | Thees et al. | |
| 2014/0054706 A1 | 2/2014 | Liu et al. | |
| 2014/0357040 A1 * | 12/2014 | Loubet et al. | 438/299 |
| 2015/0091094 A1 * | 4/2015 | Wan et al. | 257/369 |

OTHER PUBLICATIONS

Tong et al, pending U.S. Appl. No. 13/938,786, filed Jul. 10, 2013, entitled "Method of Forming Fins With Recess Shapes".

* cited by examiner

*Primary Examiner* — Asok K Sarkar
(74) *Attorney, Agent, or Firm* — Heslin Rothenberg Farley & Mesiti P.C.

(57) ABSTRACT

A method for forming FinFETs with reduced series resistance includes providing an intermediate semiconductor structure comprising a semiconductor substrate, a fin disposed on the semiconductor substrate, a gate disposed over a first portion of the fin, and a first sidewall spacer disposed over the fin and adjacent to the gate, increasing epitaxially the thickness of a second portion of the fin disposed outside the gate and the first sidewall spacer, and forming a second sidewall spacer disposed over the second portion of the fin and adjacent to the first sidewall spacer. A thickness of the second portion of the fin disposed under the second spacer is equal to or greater than a thickness of the first portion of the fin disposed under the gate.

20 Claims, 13 Drawing Sheets

NFET

FIG. 31

PFET

METHODS FOR FORMING FINFETS WITH REDUCED SERIES RESISTANCE

TECHNICAL FIELD

The present disclosure relates generally to conductive circuits and methods of forming conductive circuits, and more particularly, to epitaxial treatment of a fin in the fabrication of a FinFET structure having reduced series resistance.

BACKGROUND OF THE DISCLOSURE

Conventionally, FinFET fabrication employs implants such as halo and extension implants which result in the fin surface being amorphized, i.e., converted from a crystalline material into an amorphous one. Clean up steps following the implants attack the amorpharized fin surface making the fin thinner, particularly for multi-Vt flow devices which employ many halo and extension implants. The reduced thickness fin, particularly the portion disposed under spacers or sidewalls disposed adjacent to the sides of the gate, increases resistance which degrades the device performance.

There is a need for improved methods for forming FinFETs with reduced series resistance.

SUMMARY OF THE DISCLOSURE

The shortcomings of the prior art are overcome and additional advantages are provided through the provision, in one aspect, of a method which includes, for instance, providing an intermediate semiconductor structure having a semiconductor substrate, a fin disposed on the semiconductor substrate, a gate disposed over a first portion of the fin, and a first sidewall spacer disposed over the fin and adjacent to the gate, increasing epitaxially the thickness of a second portion of the fin disposed outside the gate and the first sidewall spacer, and forming a second sidewall spacer disposed over the second portion of the fin and adjacent to the first sidewall spacer. A thickness of the second portion of the fin disposed under the second spacer is equal to or greater than a thickness of the first portion of the fin disposed under the gate.

In another aspect, a semiconductor structure includes a semiconductor substrate, a fin disposed on the substrate, a gate disposed over a first portion of the fin, and a first sidewall spacer disposed over the fin and adjacent to the gate. The fin has a second portion disposed outside the gate and the first sidewall spacer, the second portion of the fin has an epitaxially grown increased thickness. A second sidewall spacer is disposed over the second portion of the fin and adjacent to the first sidewall spacer. The thickness of the second portion of the fin disposed under the second spacer is equal to or greater than the thickness of the first portion of the fin disposed under the gate.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

The present disclosure addresses and enhances, inter alia, fin formation during semiconductor fabrication, and more specifically, to epitaxial treatment of a fin during semiconductor fabrication employing implant processes. For example, the technique of the present disclosure may include after forming a gate, forming or generating a thicken fin particularly to balance the fin erosion or fin induced thickness/width loss during halo and/or extension implants. The thickened fin may be formed or generated before spacer formation so that the thickened fin will be disposed under the spacer. As described in greater detail below, epitaxial treatment of the fin enables maintaining or increasing fin thickness/width particularly under spacer(s) or sidewall(s) disposed adjacent to a gate during semiconductor fabrication. In some embodiments, additional masks may not be required. For example, in one embodiment, an epitaxial process may be employed for thickening the fin and followed by N/P extension implants. In another embodiment, in-situ doped epitaxies for N/P may be employed so that N/P extension implants may be avoided or eliminated. In addition, fin fabricated in accordance with the techniques of the present disclosure may also be made to be gradually thicker from fin under gate to the fin under spacer to the source or drain. With such semiconductor devices, performance may be improved. For example, the present technique may reduce the high external resistance introduced from fin erosion during the fabrication of the FinFET. In addition, the fin thickness, particularly under the spacer may be designed with consideration of balancing resistance and capacitance.

Figure 1:
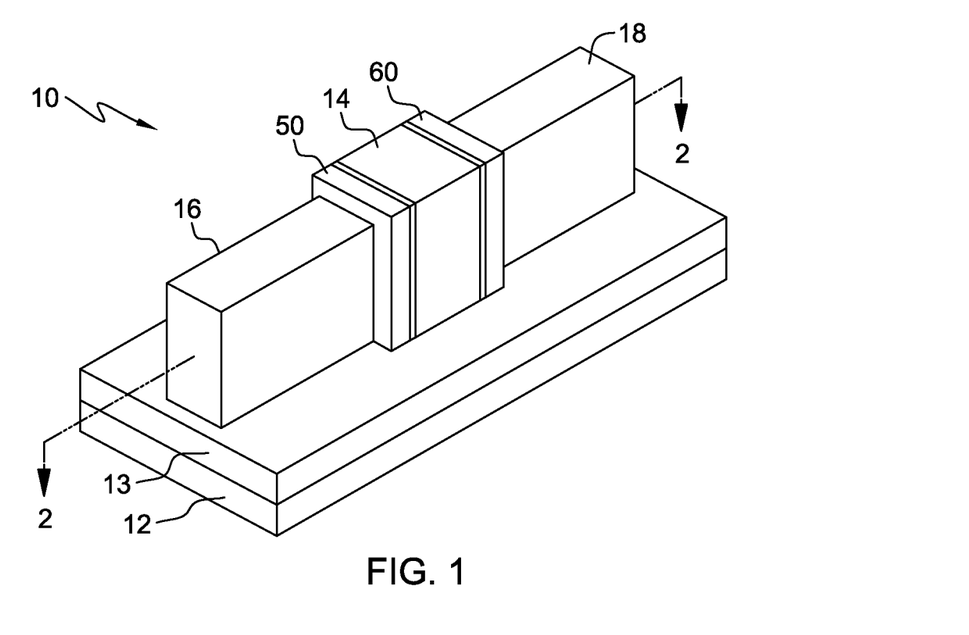
FIG. 1 is a perspective view of an embodiment of an intermediate semiconductor structure employing epitaxial treatment of a fin during fabrication in accordance with aspects of the present disclosure.
Figure 2:
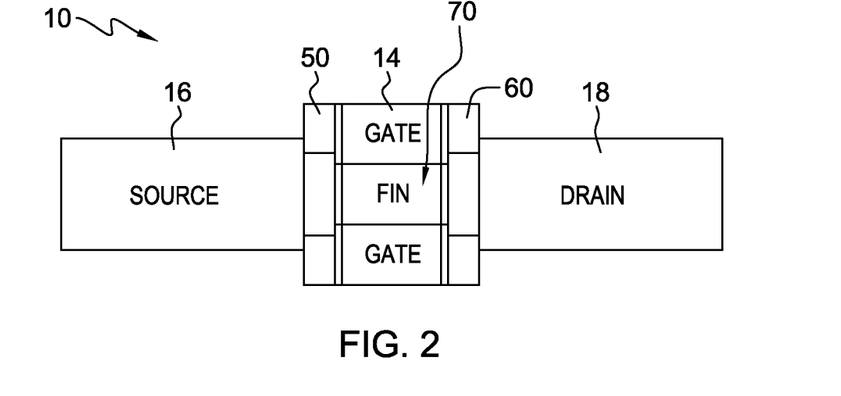
FIG. 2 is a cross-sectional view of the structure of FIG. 1 taken along line 2-2 of FIG. 1.
Figure 3:
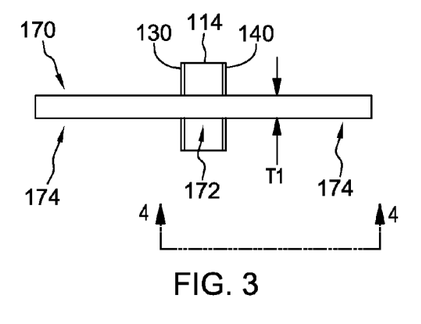
FIGS. 3-10 are cross-sectional and perspective views illustrating an embodiment of a method employing epitaxial treatment of a fin during fabrication of an intermediate semiconductor structure in accordance with aspects of the present disclosure.

FIG. 1 illustrates one embodiment of an intermediate FinFET (field effect transistor) semiconductor structure 10 obtained in accordance with one or more aspects of the present disclosure. For example, the illustrated intermediate structure 10 may generally include a substrate 12, a gate 14, a source 16, a drain 18, and sidewalls or spacers 50 and 60 disposed adjacent to the sides of the gate. An isolation layer 13 may be disposed on substrate 12. As shown in FIG. 2, intermediate FinFET semiconductor structure 10 includes a fin 70 disposed under gate 14 and under spacer 50 and 60. The fin may have a thickness/width disposed under the gate, and a thickness/width equal to or greater disposed under the spacer. For example, as shown in FIG. 2, the thickness of the fin disposed under the spacer may be greater than the thickness of the fin disposed under the gate. It will be understood that the positioning of the source and drain areas could be switched.

The basic structure of a field effect transistor is typically formed by forming various layers of material and thereafter patterning those layers of material using known photolithography and etching processes. Various doped regions, e.g., source regions, drain regions, extension regions, halo regions, etc., are typically formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits millions of transistors, e.g., NFET transistors and/or PFET transistors are formed on a substrate by performing a number of process operations.

Figure 4:
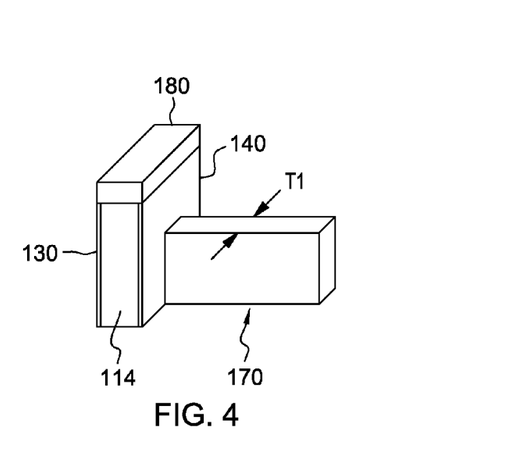

FIGS. 3-10 illustrate cross-sectional and perspective views of one embodiment of a method employing epitaxial treatment of a fin during fabrication of an intermediate semiconductor structure in accordance with aspects of the present disclosure. For example, as shown in this exemplary embodiment, initially in FIGS. 3 and 4 (FIG. 4 illustrating one side of the fin shown in FIG. 3), an intermediate semiconductor structure may include a fin 170 disposed on a substrate, such as substrate 12 (FIG. 1), a gate 114, and first sidewalls spacers 130 and 140 disposed over fin 170 and adjacent to the sides of the gate. Fin 170 may include a first portion 172 disposed under the gate and the first sidewall spacers also having a first thickness T1, and a second portion 174 extending away from the first sidewall spaces having a thickness T1. During fabrication, a hard mask 180 (FIG. 4) may be disposed over gate 114.

Figure 5:
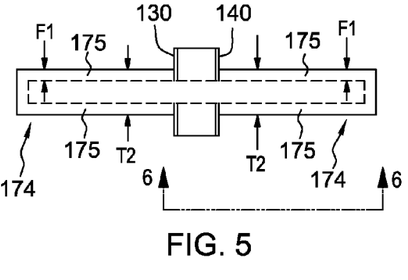
Figure 6:
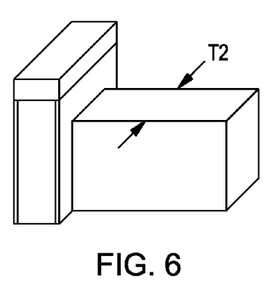

As shown in FIGS. 5 and 6, an epitaxy process is employed to increase the thickness of second portion 174 so that the thickened fin disposed outside the gate and sidewall spacers 130 and 140 has a second thickness T2. For example, the epitaxy process may employ a deposition of a crystalline overlayer 175 on the crystalline fin, where there is registry between the overlayer and the fin. The epitaxial film or overlayer 175 may have a thickness of F1. The epitaxial film or overlayer may be grown from gaseous or liquid precursors. For example, the fin may be formed from silicon or germanium, and the deposited film or overlayer may be formed from silicon, or germanium, or SiGe. More generally, the epitaxial material may be a single semiconductor material or a combination from Groups III-V of the Periodic Table of Elements.

Figure 7:
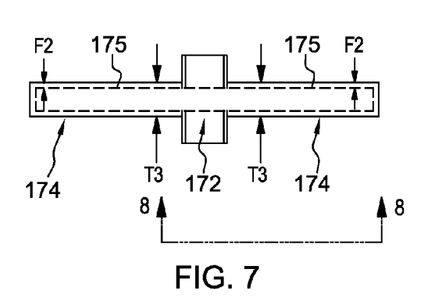
Figure 8:
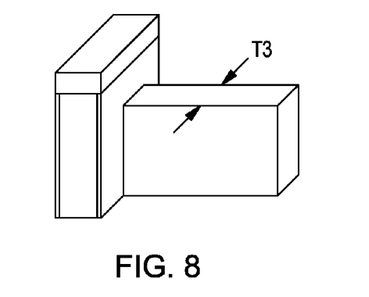

One or more implanting and cleaning steps may be performed on the intermediate structure of FIGS. 5 and 6 resulting in amorpharizing of the surface of the fin such as the deposited film or overlayer, and removal of the amorpharized portion of the fin such as the deposited film or overlayer, as shown in FIGS. 7 and 8. The resulting second portion 174 of the fin, after the implanting and cleaning, has a thickness T3. The epitaxial film or overlayer 175 may have a thickness of F2 which is less that the thickness F1 (FIG. 5).

Figure 9:
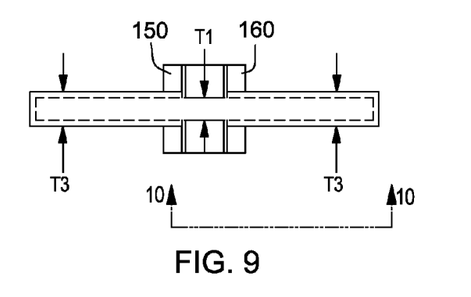
Figure 10:
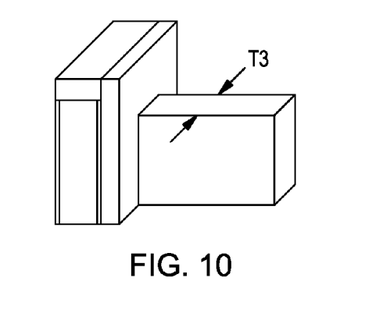

As shown in FIGS. 9 and 10, a second sidewall spacers 150 and 160 are disposed over the fin having third thickness T3 and adjacent to the first sidewall spacer. Third thickness T3 of the fin disposed under the second spacer may be equal to or greater than first thickness T1 of the fin disposed under the gate. Thereafter, the exposed portions of the fins may be built up to form a source and a drain.

Figure 11:
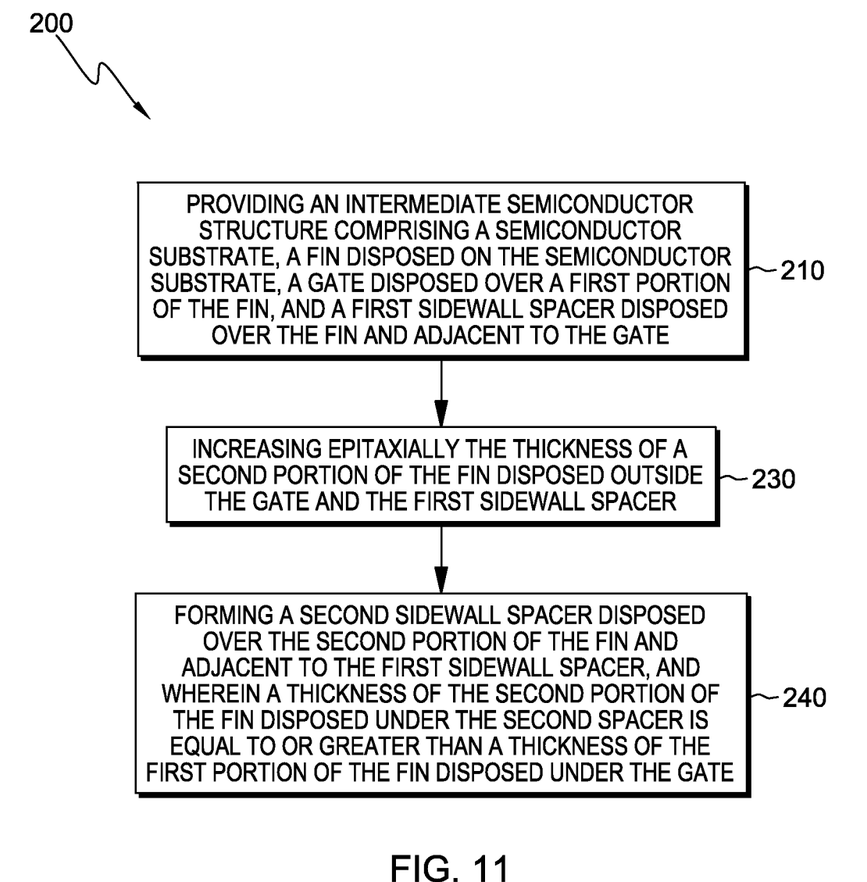
FIG. 11 is a flowchart illustrating another method employing epitaxial treatment of a fin during fabrication of an intermediate semiconductor structure in accordance with aspects of the present disclosure.
Figure 12:
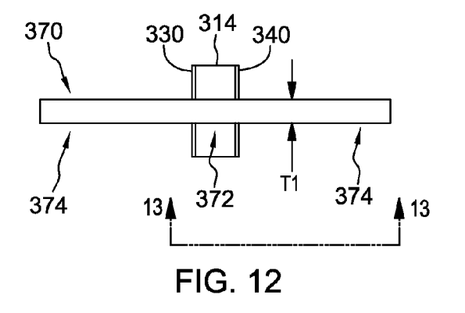
FIGS. 12-21 are cross-sectional and perspective views illustrating an embodiment of a method employing epitaxial treatment of a fin during fabrication of an intermediate semiconductor structure in accordance with aspects of the present disclosure.

FIG. 11 is a flowchart of another embodiment of a method 200, which may be similar to aspects of the method shown in FIGS. 3-10, employing epitaxial treatment of a fin during fabrication of an intermediate semiconductor structure in accordance with aspects of the present disclosure. For example, in this exemplary embodiment, at 210, an intermediate semiconductor structure is provided having a semiconductor substrate, a fin disposed on the semiconductor substrate, a gate disposed over a first portion of the fin, a first sidewall spacer disposed over the fin and adjacent to the gate. At 230, the thickness of a second portion of the fin disposed outside the gate and first sidewall spacer is increased epitaxially. At 240, a second sidewall spacer is formed over the second portion of the fin and adjacent to the first sidewall spacer, and wherein the thickness of the second portion of the fin disposed under the second spacer is equal to or greater than the thickness of the first portion of the fin disposed under the gate.

Figure 13:
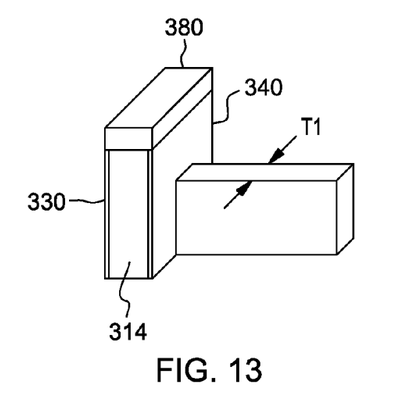

FIGS. 12-21 illustrate cross-sectional and perspective views of another embodiment of a method employing epitaxial treatment of a fin during fabrication of an intermediate semiconductor structure in accordance with aspects of the present disclosure. For example, as shown in this exemplary embodiment, initially in FIGS. 12 and 13 (FIG. 13 illustrating one side of the fin shown in FIG. 12), an intermediate semiconductor structure may include a fin 370 disposed on a substrate, such as substrate 12 (FIG. 1), a gate 314, and first sidewalls spacers 330 and 340 disposed over fin 370 and adjacent to the sides of the gate. Fin 370 may include a first portion 372 disposed under the gate and first sidewall spacers having a first thickness T1, and a second portion 374 extending away from the first sidewall spaces having a thickness T1. During fabrication, a hard mask 380 (FIG. 13) may be disposed over gate 314.

Figure 14:
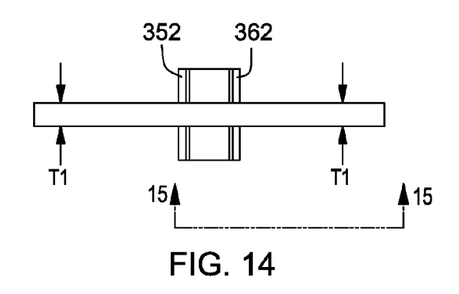
Figure 15:
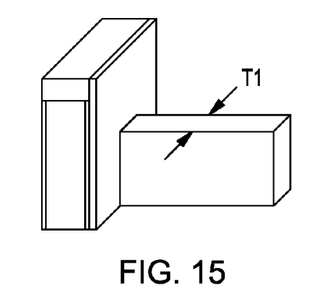

As shown in FIGS. 14 and 15, a first portions 352 and 362 of second sidewall spacers are disposed over the fin having first thickness T1 and adjacent to the first sidewall spacer.

Figure 16:
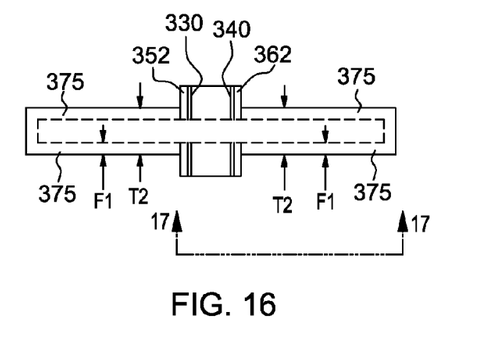
Figure 17:
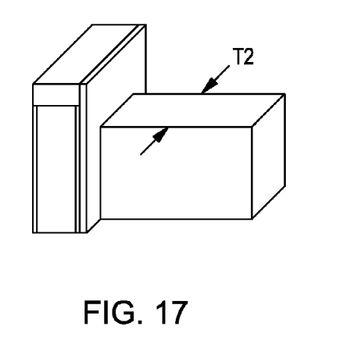

As shown in FIGS. 16 and 17, an epitaxy process is employed to increase the thickness of second portion 374 so that the thickened fin disposed outside the gate, sidewall spacers 330 and 340, and first portions 352 and 362 of second sidewall spacers, has a second thickness T2. For example, the epitaxy process may employ a deposition of a crystalline overlayer 375 on the crystalline fin, where there is registry between the overlayer and the fin. The epitaxial film or overlayer 375 may have a thickness of F1. The epitaxial film or overlayer may be grown from gaseous or liquid precursors. The epitaxial film or overlayer may be of the same composition as the fin or may be different. For example, the fin may be formed from silicon or germanium, and the deposited film or overlayer may be formed from silicon, or germanium, or SiGe. More generally, the epitaxial material may be a single semiconductor material or a combination from Groups III-V of the Periodic Table of Elements.

Figure 18:
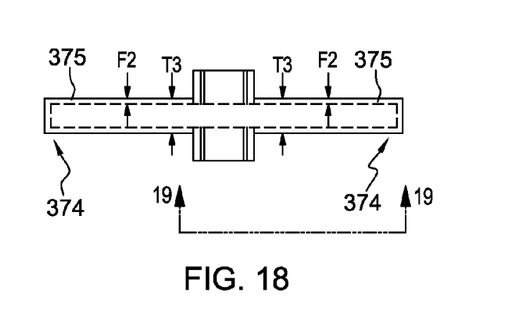
Figure 19:
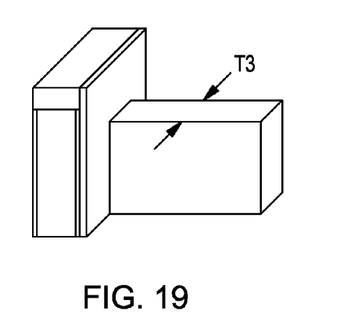

One or more implanting and cleaning steps may be performed on the intermediate structure of FIGS. 16 and 17 resulting in amorpharizing of the surface of the fin such as the deposited film or overlayer, and removal of the amorpharized portion of the fin such as the deposited film or overlayer, as shown in FIGS. 18 and 19. The resulting second portion 374 of the fin has a thickness T3. The epitaxial film or overlayer 375 may have a thickness of F2 which is less that the thickness F1 (FIG. 16).

Figure 20:
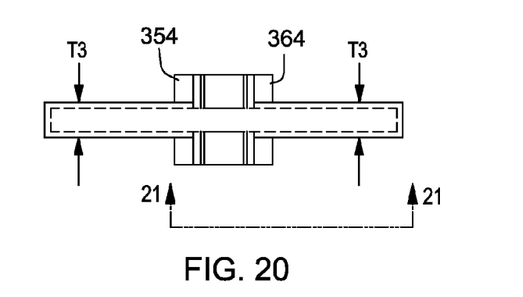
Figure 21:
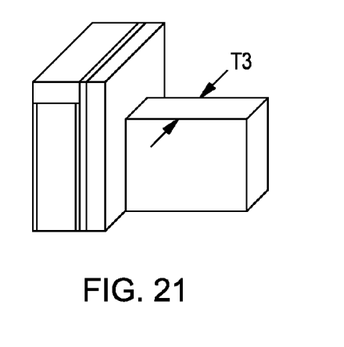

As shown in FIGS. 20 and 21, a second portion 354 and 364 of the second sidewall spacers are disposed over the fin having third thickness T3 and adjacent to the first sidewall spacer. Third thickness T3 of the fin disposed under the second portion of the second spacer may be equal to or greater than first thickness T1 of the fin disposed under the gate. Thereafter, the exposed portions of the fins may be built up to form a source and a drain.

Figure 22:
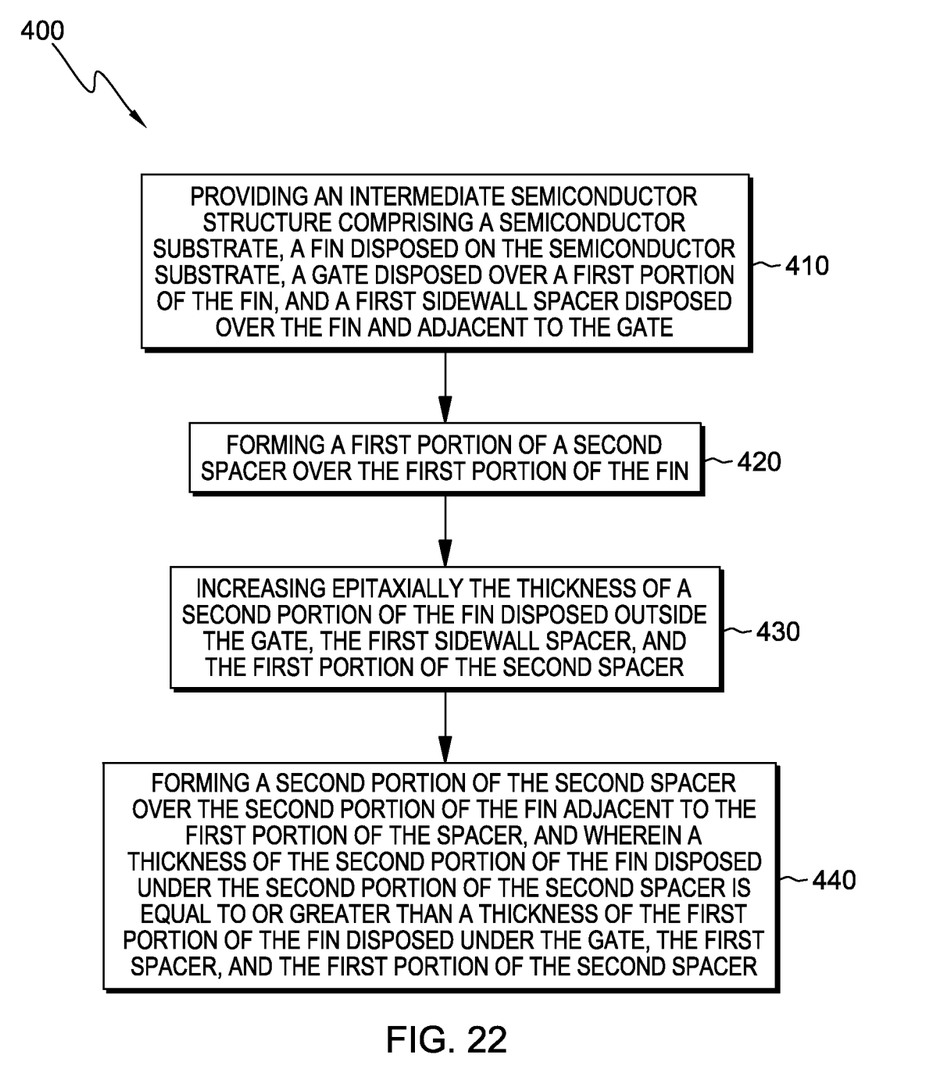
FIG. 22 is a flowchart illustrating another method employing epitaxial treatment of a fin during fabrication of an intermediate semiconductor structure in accordance with aspects of the present disclosure.

FIG. 22 is a flowchart of another embodiment of a method 400, which may be similar to aspects of the method shown in FIGS. 12-21, employing epitaxial treatment of a fin during fabrication of an intermediate semiconductor structure in accordance with aspects of the present disclosure. For example, in this exemplary embodiment, at 410, an intermediate semiconductor structure is provided having a semiconductor substrate, a fin disposed on the semiconductor substrate, a gate disposed over a first portion of the fin, a first sidewall spacer disposed over the fin and adjacent to the gate. At 420, a first portion of a second spacer is formed over the first portion of the fin. At 430, the thickness of a second portion of the fin disposed outside the gate, the first sidewall spacer, and the first portion of the second space, is increased epitaxially. At 440, a second portion of the second spacer is formed over the second portion of the fin adjacent to the first portion of the second spacer, wherein the thickness of the second portion of the fin disposed under the second portion of the second spacer is equal to or greater than the thickness of the first portion of the fin disposed under the gate, the first spacer, and the first portion of the second spacer.

FIGS. 23-32 illustrate cross-sectional and perspective views of another embodiment of a method employing epitaxial treatment of a fin during fabrication of an intermediate semiconductor structure in accordance with aspects of the present disclosure. In this illustrated embodiment, a thicken fin may be generated epitaxially with in situ doping. For example, with this technique, the follow-up implantation steps can be skipped or avoided which may reduce damage to the silicon surface or substrate induced by implantations. The in-situ doped epitaxial process may be separate for N and P, and extra masks may not be required. For example, the N/P extension implant masks may be employed or replaced with in-situ epitaxial masks whereby the total number of masks remains the same compared to the methods illustrated in FIGS. 3-11 and FIGS. 12-22.

Figure 23:
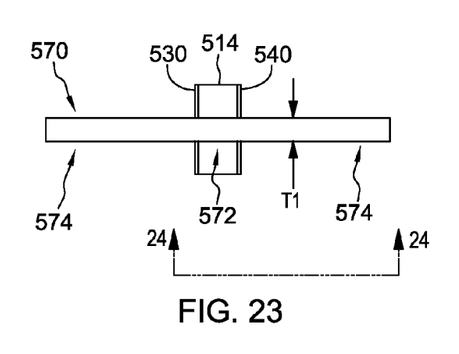
FIGS. 23-32 are cross-sectional and perspective views illustrating another embodiment employing epitaxial treatment of a fin during fabrication of an intermediate semiconductor structure in accordance with aspects of the present disclosure.
Figure 24:
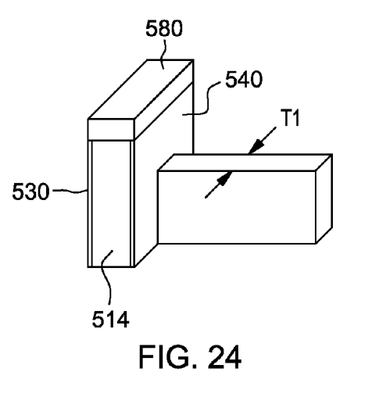

For example, as shown in this exemplary embodiment, initially in FIGS. 23 and 24, an intermediate semiconductor structure for forming an NFET or a PFET may include a fin 570 disposed on a substrate, such as substrate 12 (FIG. 1), a gate 514, and first sidewalls spacers 530 and 540 disposed over fin 570 and adjacent to the sides of the gate. Fin 570 may include a first portion 572 disposed under the gate and first sidewall spacers having a first thickness T1, and a second portion 574 extending away from the first sidewall spaces having a thickness T1. During fabrication, a hard mask 580 (FIG. 24) may be disposed over gate 514.

Figure 25:
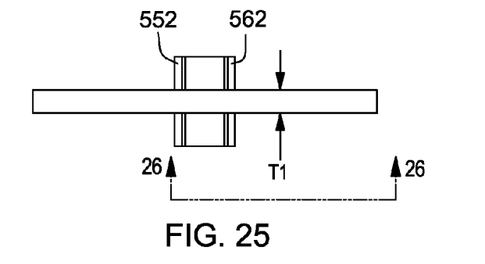
Figure 26:
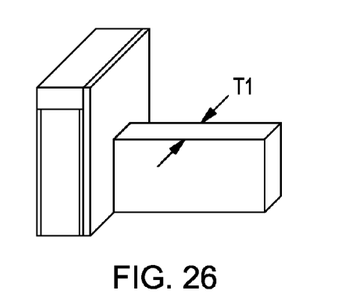

As shown in FIGS. 25 and 26, first portions 552 and 562 of second sidewall spacers are disposed over the fin having first thickness T1 and adjacent to the first sidewall spacer.

Figure 27:
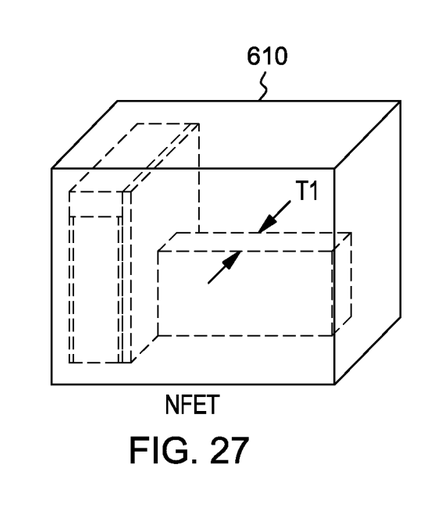
Figure 28:
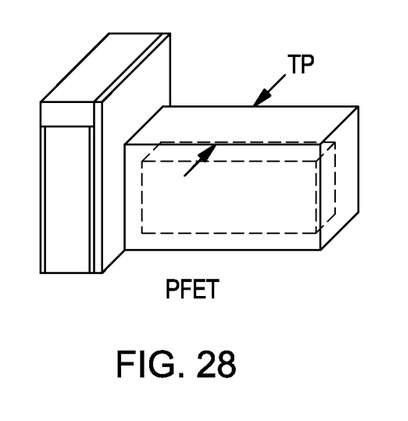

FIGS. 27-30 illustrate the process for forming intermediate semiconductor NFET and PFET devices having a thickened fin. For example, with reference to FIG. 27, deposition of a hardmask and pattern 610 covers a first fin having thickness T1 and the gate for forming an NFET. For example, a hardmask layer may be deposited followed by a lithographic patterning step to open the mask on the PFET while maintaining protection on the NFET. With the first fin and gate covered for forming an NFET as shown in FIG. 27, a second fin and gate initially having a thickness T1 (FIG. 26) is thickened by epitaxial growth such as by in-situ doped extension for forming a PFET to have a thickness TP as shown in FIG. 28. For example, for the open PFET, Boron in-situ doped epitaxy may be used to generate the thickened fin. For the protected NFET, there is no epitaxy growth on the fin.

Figure 29:
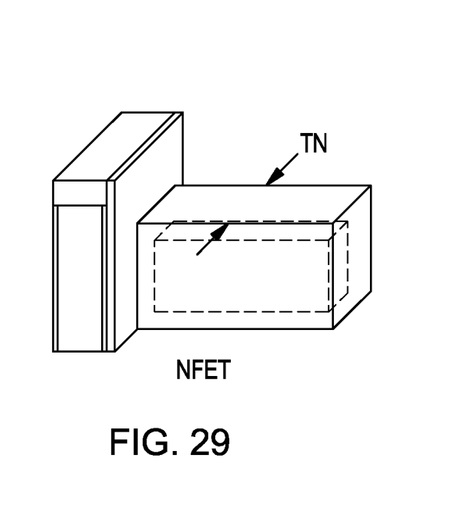
Figure 30:
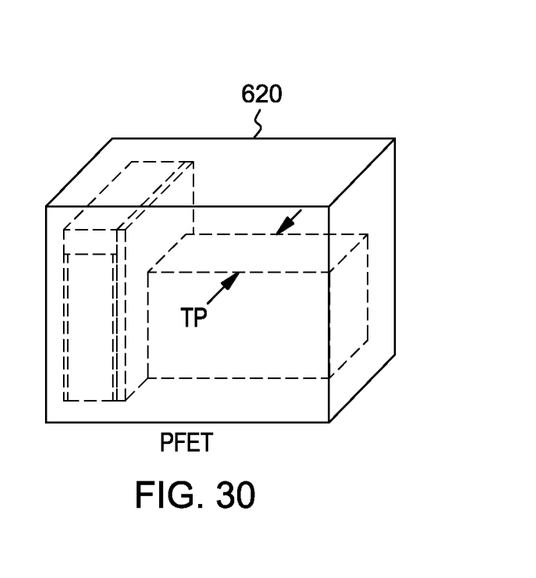

A hardmask layer may be deposited followed by a lithographic patterning step to open the mask on the NFET while maintaining protection on the PFET as shown in FIGS. 29 and 30. With the second fin and gate covered for forming a PFET as shown in FIG. 30, the first fin and gate shown in FIG. 29 is thickened by epitaxial growth with, for example, in-situ doped extension for forming the NFET to have a thickness TN. For example, for the open NFET, phosphorus or Arsenic in-situ doped epitaxy may be used to generate thickened fin. For the protected PFET, there is no epitaxy growth on the fin.

The hard mask disposed over the epitaxially thickened second portion of the fin for forming the PFET shown in FIG. 30 is removed.

Figure 31:
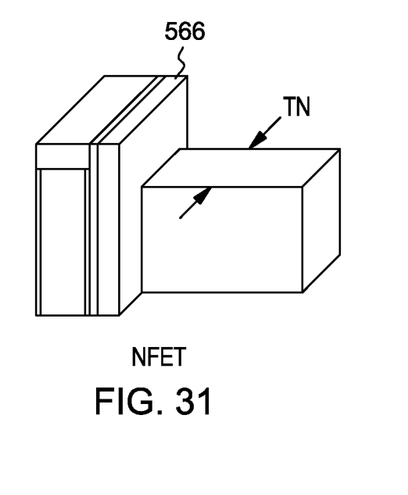
Figure 32:
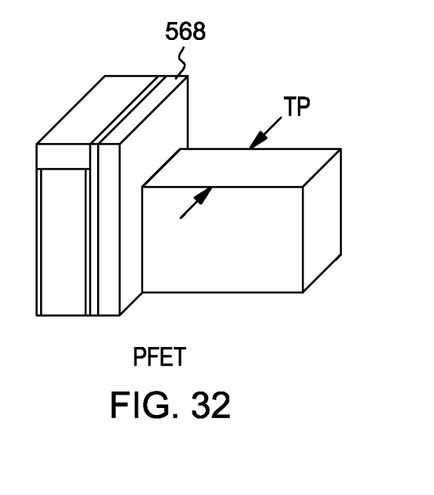

As shown in FIGS. 31 and 32, a second portion 566 and 568 of the second sidewall spacers are disposed over the fins having second thickness TN and TP and adjacent to the first sidewall spacer. Second thickness TN or TP of the fins disposed under the second portion of the second spacer may be equal to or greater than first thickness T1 of the fin disposed under the gate. Thereafter, the exposed portions of the fins may be built up to form a source and a drain. In addition, it will be appreciated that the initial thickness of the fins for the NFET and PFET may be different, and the thickened thickness of the NFET and PFET may be different.

Figure 33:
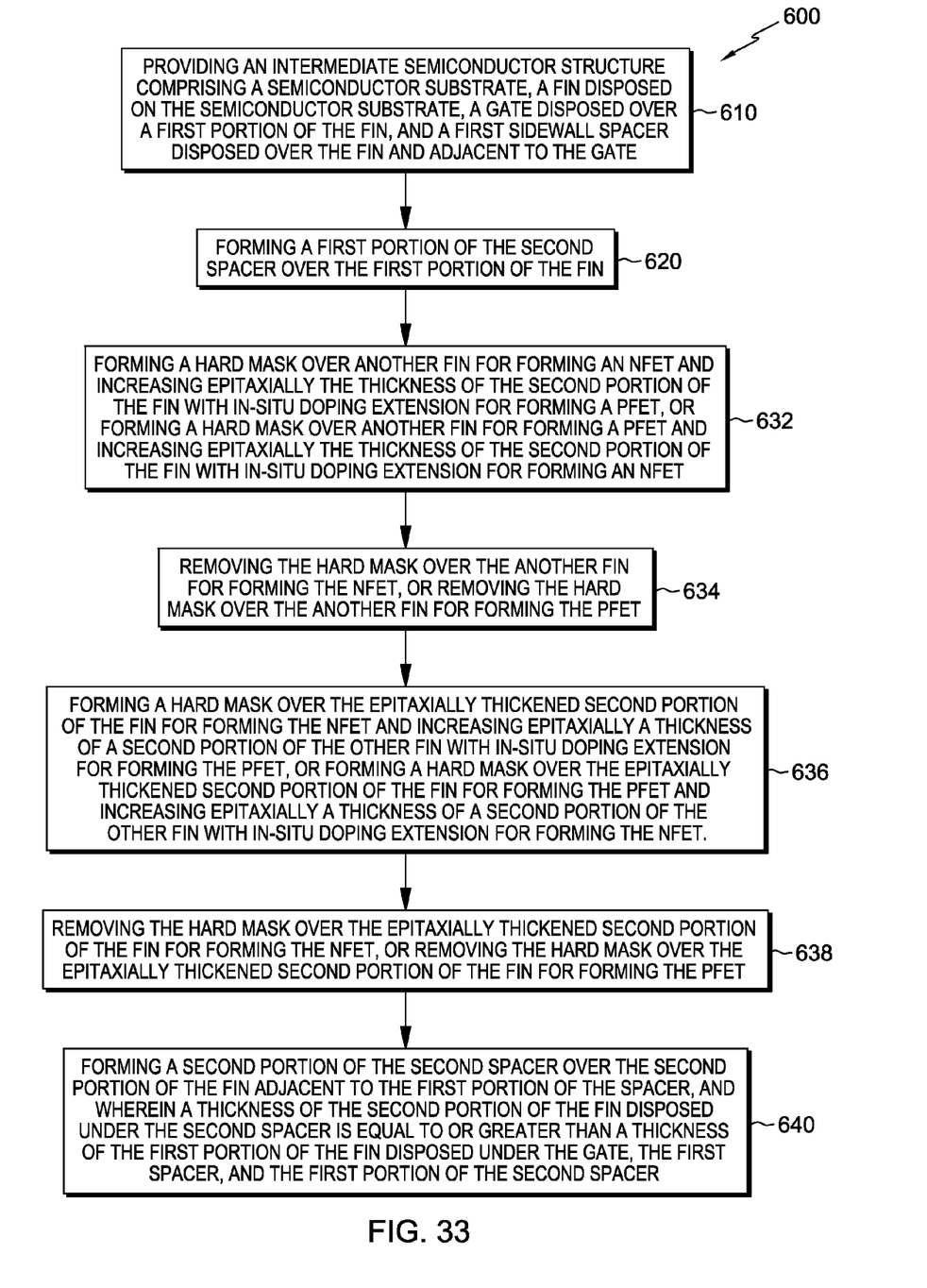
FIG. 33 is a flowchart illustrating another method employing epitaxial treatment of a fin during fabrication of an intermediate semiconductor structure in accordance with aspects of the present disclosure.

FIG. 33 illustrates a flowchart of another embodiment of a method 600, which may be similar to aspects of the method shown in FIGS. 23-32 employing epitaxial treatment of a fin during fabrication of an intermediate semiconductor structure in accordance with aspects of the present disclosure. For example, in this exemplary embodiment, at 610, an intermediate semiconductor structure is provided having a semiconductor substrate, a fin disposed on the semiconductor substrate, a gate disposed over a first portion of the fin, a first sidewall spacer disposed over the fin and adjacent to the gate, and wherein the fin having a first portion having a first thickness is disposed under the gate and first sidewall spacer. At 620, a first portion of a second spacer is formed over the first portion of the fin.

At 632, a hard mask is formed over another fin for forming an NFET and the thickness of the second portion of the fin is epitaxially increased with in-situ doping extension for forming a PFET, or a hard mask is formed over another fin for forming a PFET and the second portion of the fin is epitaxially increased with in-situ doping extension for forming an NFET. At 634, the hard mask disposed over the another fin for forming the NFET is removed, or the hard mask disposed over the another fin for forming the PFET is removed.

At 636, a hard mask is formed over the epitaxially thickened second portion of the fin for forming the NFET and increasing epitaxially a thickness of a second portion of the other fin with in-situ doping extension for forming the PFET, or a hard mask is formed over the epitaxially thickened second portion of the fin for forming the PFET and increasing epitaxially a thickness of a second portion of the other fin with in-situ doping extension for forming the NFET. At 638, the hard mask over the epitaxially thickened second portion of the fin for forming the NFET is removed, or the hard mask over the epitaxially thickened second portion of the fin for forming the PFET is removed.

At 640, a second portion of the second spacer is formed over the second portion of the fin adjacent to the first portion of the spacer, and wherein the thickness of the second portion of the fin disposed under the second spacer is equal to or greater than the thickness of the first portion of the fin disposed under the gate, the first spacer, and the first portion of the second spacer.

Figure 34:
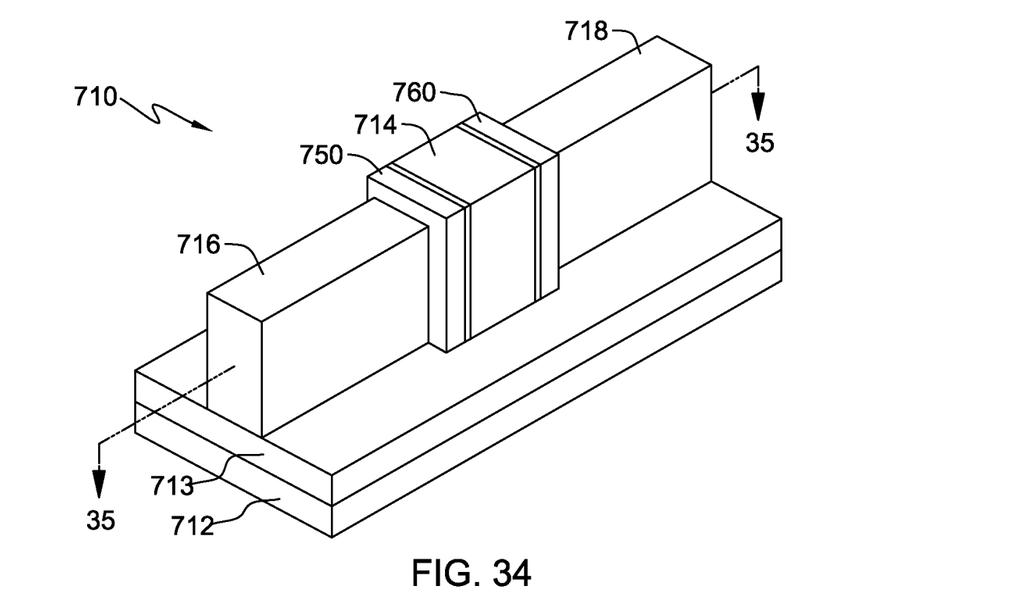
FIG. 34 is a perspective view of another embodiment of an intermediate semiconductor structure employing epitaxial treatment of a fin during fabrication in which the fin and the substrate are not linked together in accordance with aspects of the present disclosure.
Figure 35:
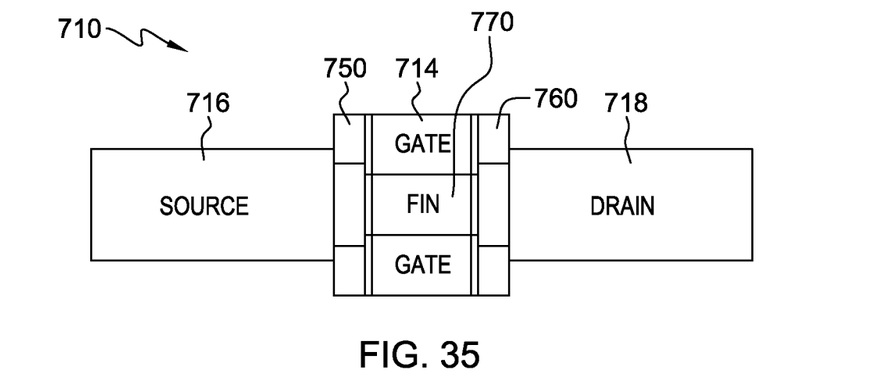
FIG. 35 is a cross-sectional view of the structure of FIG. 35 taken along line 35-35 of FIG. 34.

FIG. 34 illustrates another embodiment of an intermediate semiconductor structure employing epitaxial treatment of a fin during fabrication, such as described above, obtained in accordance with one or more aspects of the present disclosure. For example, an intermediate semiconductor structure 710 may generally include a substrate 712, a gate 714, a source 716, a drain 718, and sidewalls or spacers 750 and 760 disposed adjacent to the sides of the gate. An isolation layer 713 may be disposed on substrate 712. As shown in FIG. 35, intermediate FinFET semiconductor structure 710 may includes a fin 770 disposed under gate 714 and under spacer 750 and 760. The fin may have a thickness/width disposed under the gate, and a thickness/width equal to or greater disposed under the spacer. The thickness of the fin disposed under the spacer may be greater than the thickness of the fin disposed under the gate. In addition, as shown in FIG. 34, intermediate semiconductor structure 710 may be an intermediate SOI FinFET semiconductor structure in which fin 770 and substrate 712 are not linked together or otherwise isolated from each other via isolation layer 713 such as a Buried Oxide (BOx). Because of the buried oxide layer, adjacent fins are fully isolated from each other and no additional isolation steps are needed. It will be understood that the positioning of the source and drain areas could be switched.

Figure 36:
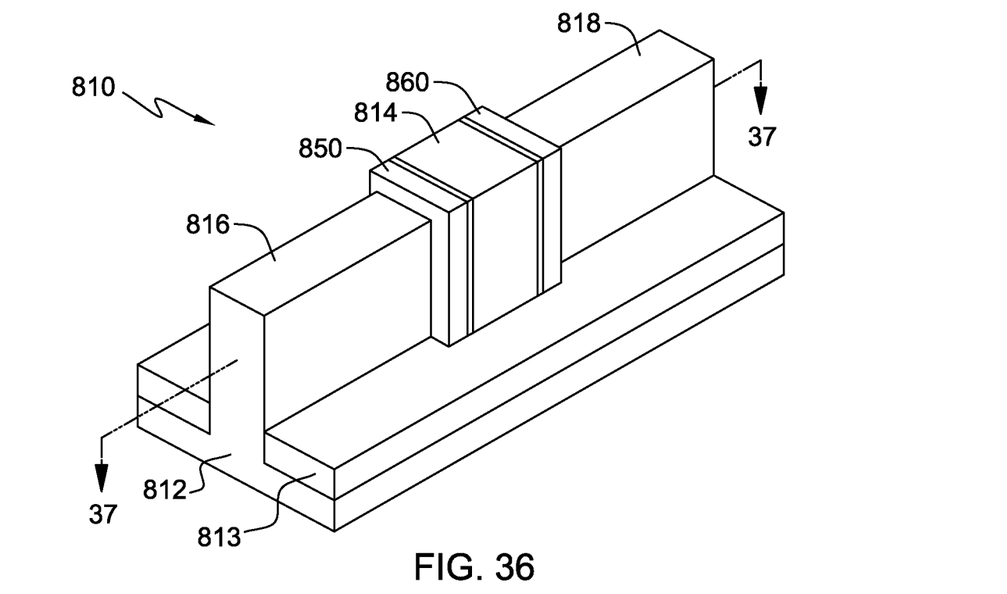
FIG. 36 is a perspective view of another embodiment of an intermediate semiconductor structure employing epitaxial treatment of a fin during fabrication in which the fin and the substrate are linked together in accordance with aspects of the present disclosure.
Figure 37:
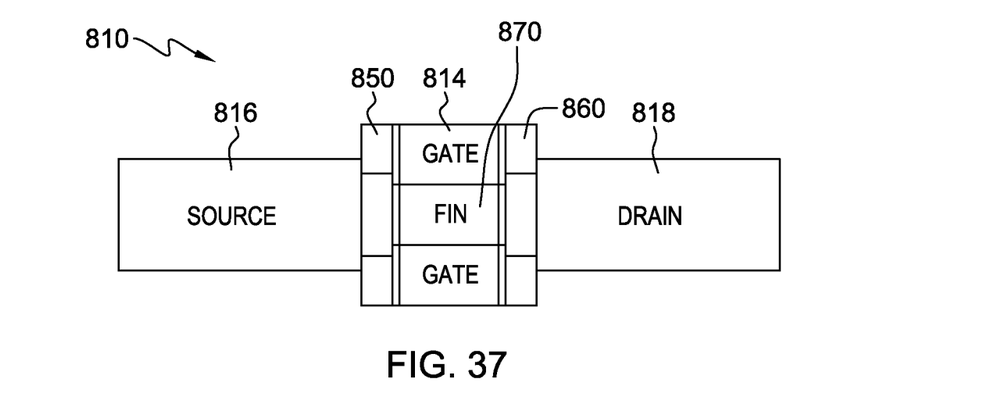
FIG. 37 is a cross-sectional view of the structure of FIG. 36 taken along line 37-37 of FIG. 36.

FIG. 36 illustrates another embodiment of an intermediate semiconductor structure employing epitaxial treatment of a fin during fabrication, such as described above, obtained in accordance with one or more aspects of the present disclosure. For example, an intermediate semiconductor structure 810 may generally include a substrate 812, a gate 814, a source 816, a drain 818, and sidewalls or spacers 850 and 860 disposed adjacent to the sides of the gate. An isolation layer 813 may be disposed on substrate 812. As shown in FIG. 37, intermediate FinFET semiconductor structure 810 may includes a fin 870 disposed under gate 814 and under spacer 850 and 860. The fin may have a thickness/width disposed under the gate, and a thickness/width equal to or greater disposed under the spacer. The thickness of the fin disposed under the spacer may be greater than the thickness of the fin disposed under the gate. In addition, as shown in FIG. 36, intermediate semiconductor structure 810 may be an intermediate bulk FinFET semiconductor structure in which fin 870 and substrate 812 are linked together. The oxide layer may employ shallow trench isolation (STI), also known as Box Isolation Technique, to inhibit electrical current leakage between adjacent semiconductor device components. It will be understood that the positioning of the source and drain areas could be switched.

One or more advantages may be obtained in accordance with the various aspects of the technique of the present disclosure. For example, the technique of the present disclosure may allow for maintaining fin thickness during implants in which the fin surface will be amorpharized or converted from a crystalline material into an amorphous one. Such techniques overcome prior art processes in which the clean steps, after the implants, attack the fin surface making the fin thinner and can be especially problematic when there are many implants and clean up steps, for example in the fabrication for multi-Vt flow. The present technique allows maintaining or increasing the fin thickness for providing an increased fin thickness compared to prior art processes in which a fin may be thinned down by half, e.g., from about 10 nanometers to about 11 nanometers to about 5 nanometers to about 6 nanometers. Increasing the thickness of the fin under the spacer reduces the resistance of the fin, and the fin erosion issue induced from implant may be balanced or overcome. In prior art devices, the spacer thickness may be about 4 nanometers, and a gate length may be about 20 nanometers to about 30 nanometers. Prior art devices having two side spacers results in fins being about 28 nanometers long and wherein thinned during fabrication resulting in fins having thinner size wherein resistance is a relatively large share in total series resistance. A thinned fin will introduce higher resistance which further degrades device performance compared to the fin having a greater thickness.

In addition, the present technique may be compatible with existing 14 nanometer FinFET technology and further developed technologies with FinFET or/and nano-wire based semiconductor devices. In the embodiments shown in FIGS. 3-11, and FIGS. 12-22, no additional extra mask may be required. By thickening of the fin under the spacer, series resistance may be reduced, if not significantly reduced, which may benefit device performance. In-situ doped epitaxy technique may be employed which may reduce implant induced damage, and may result in a more uniform extension junction. Raised source/drains may be formed after spacer formation to finalize a device structure.

It will be appreciated that the present technique may result in changing the spacer thickness which may improve the device, but which may also introduce side effects such as parasitic capacitance increase compared to the prior art. Such an increase in the spacer thickness may require total process package changes, such as silicon recess, epitaxy, and etc. The thickened fin may also contain high extension dose (by implants) which may result in lower resistance as it may build a link from channel to the source/drain.

In the above embodiments, the substrate may include, for example, a semiconductor material. As one skilled in the art will understand, where, as in the present example, a semiconductor material is used, many gates may be formed, such that what is shown in the figures is repeated a large number of times across the substrate such as a wafer. The semiconductor material may include, but not limited to, silicon (Si), germanium (Ge), a compound semiconductor material, a layered semiconductor material, a silicon-on-insulator (SOI) material, a SiGe-on-insulator (SGOI) material, and/or a germanium-on-insulator (GOI) material.

The substrate may in addition or instead include various isolations, dopings and/or device features. For example, active regions, and isolation regions may be defined on a semiconductor substrate using an isolation process. The formation of isolation regions, such as isolation trenches, may typically include forming a recess on the substrate and filling the recess with a dielectric film using a chemical vapor deposition (CVD) process, for example, a low pressure CVD (LPCVD), a high-density CVD (HDCVD), or plasma enhanced CVD (PECVD), then performing a chemical mechanical polish (CMP) to remove any excess dielectric film filling the shallow isolation trenches. The isolation regions may be filled with dielectric materials, for example, silicon oxide, silicon nitride, and the like. The isolation regions may then be annealed.

A dielectric layer, for example, a gate oxide, may be disposed on the substrate. In one example, a dielectric layer may include silicon dioxide ($SiO_2$) and may be thermally grown or deposited by a number of different processes, for example, a chemical vapor deposition (CVD) process.

The gate may be formed from a gate material, for example, amorphous silicon. In some embodiments, the gate material may be applied, chemical mechanical planarization (CMP) may be performed on the gate material. One or layers may be disposed on the gate material. For example, a chemox layer may be formed on the gate material. The chemox layer may be formed using a known growing technique, including, for example, oxidation or oxynitridation, and using a wet chemical oxidation process. In addition, a barrier layer may be applied over the gate material or chemox layer. The barrier layer may be, for example, silicon mononitride (SiN) or other materials known by those skilled in the art. A second dielectric layer may be applied over the barrier layer. The second dielectric layer may be, for example, silicon oxide. After the barrier layer and the second dielectric layer are applied over the gate material, a hard mask layer may be applied over the second dielectric layer and the device may be etched to form at least one gate. The at least one gate may include the gate material, barrier layer and the second dielectric layer. The at least one gate may include additional layers depending on the design of the semiconductor being fabricated. The resulting gate may be positioned substantially perpendicular to the direction of the fin and over a portion of the top and a portion of the side surfaces of the fins. While the present discussion is directed to formation of gates disposed over the substrate employing a "gate-first process", one skilled in art will appreciate that the gates may be fabricated using a "gate-last process" (also referred to as replacement metal gate process).

After the epitaxial treatment to thicken the fin, and after the implant process, a spacer layer may be applied over the fin, the gate, and the isolation regions. The spacer layer may then be etched to remove the spacer layer from over the fin, isolation regions, and a portion of the gate. As shown in figures, the spacer layer creates the spacer sidewall adjacent to the sides of the gate and over a top portion of the fin.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:
1. A method comprising:
provided an intermediate semiconductor structure comprising:
a semiconductor substrate;
a fin disposed on the semiconductor substrate;
a gate disposed over a first portion of the fin; and
a first sidewall spacer disposed over the fin and adjacent to the gate;
increasing epitaxially the thickness of a second portion of the fin disposed outside the gate and the first sidewall spacer;
forming a second sidewall spacer disposed over the second portion of the fin and adjacent to the first sidewall spacer; and
wherein a thickness of the second portion of the fin disposed under the second spacer is equal to or greater than a thickness of the first portion of the fin disposed under the gate.

2. The method of claim 1 further comprising, after the increasing epitaxially the thickness of the second portion of the fin, performing an implanting process in the semiconductor substrate.

3. The method of claim 2 further comprising increasing the thickness of the fin adjacent to the spacer to form a source or a drain.

4. The method of claim 1 further comprising, after the increasing epitaxially the thickness of the second portion of the fin, implanting in the semiconductor substrate an implant resulting in amorpharizing of the surface of the fin, and cleaning of the implanted intermediate semiconductor structure resulting in removal of the amorpharized portion of the fin.

5. The method of claim 1 wherein the forming the second sidewall spacer comprises forming a first portion of the second spacer over the first portion of the fin adjacent to the first side wall spacer, and forming a second portion of the second spacer over the second portion of the fin adjacent to the first portion of the spacer.

6. The method of claim 1 wherein the increasing epitaxially the thickness of the second portion of the fin comprises increasing epitaxially the thickness of the second portion of the fin with in-situ doping extension for forming a PFET, or increasing epitaxially the thickness of the second portion of the fin with in-situ doping extension for forming an NFET.

7. The method of claim 6 further comprising forming a hard mask over a fin for forming an NFET and the increasing comprises increasing epitaxially the thickness of the second portion of the fin for forming a PFET, or further comprising forming a hard mask over a fin for forming a PFET and the increasing comprises increasing epitaxially the thickness of the second portion of the fin for forming an NFET.

8. The method of claim 6 further comprising forming a hard mask over the epitaxially thickened second portion of the fin for forming a PFET and the increasing comprises increasing epitaxially the thickness of a second portion of a fin with in-situ doping extension for forming an NFET, or forming a hard mask over the epitaxially thickened second portion of the fin for forming an NFET and the increasing comprises increasing epitaxially the thickness of a second portion of a fin with in-situ doping extension for forming a PFET.

9. The method of claim 1 wherein the thickness of the fin disposed under the second spacer is equal to the first thickness of the fin disposed under the gate.

10. The method of claim 1 wherein the thickness of the fin disposed under the second spacer is greater than the first thickness of the fin disposed under the gate.

11. The method of claim 1 wherein the implanting process comprises NFET extension implants or PFET extension implants.

12. The method of claim 1 wherein the fin and the substrate are linked to each other.

13. The method of claim 1 wherein the fin and the substrate are not linked to each other.

14. A semiconductor structure comprising:
a semiconductor substrate;
a fin disposed on said substrate;
a gate disposed over a first portion of said fin; and
a first sidewall spacer disposed over said fin and adjacent to said gate;
said fin having a second portion disposed outside said gate and said first sidewall spacer, said second portion of said fin having an epitaxially grown increased thickness;
a second sidewall spacer disposed over said second portion of said fin and adjacent to said first sidewall spacer; and
wherein said thickness of said second portion of said fin disposed under said second spacer is equal to or greater than said thickness of said first portion of said fin disposed under said gate.

15. The semiconductor structure of claim 14 wherein said semiconductor substrate comprises implants.

16. The semiconductor structure of claim 14 wherein said second sidewall spacer comprises a first portion of said second spacer disposed over said first portion of said fin adjacent to said first side wall spacer, and a second portion of said second spacer disposed over said second portion of said fin adjacent to said first portion of said spacer.

17. The semiconductor structure of claim 14 wherein said second portion of said fin having said epitaxially grown increased thickness comprising an epitaxially grown increased thickness with in-situ doping extension for forming a PFET or an NFET.

18. The semiconductor structure of claim 14 wherein said thickness of said fin disposed under said second spacer is equal to said first thickness of said fin disposed under said gate.

19. The semiconductor structure of claim 14 wherein said thickness of said fin disposed under said second spacer is greater than said first thickness of said fin disposed under said gate.

20. The semiconductor structure of claim 14 wherein said semiconductor structure comprises a bulk-FinFET or an SOI-FinFET.

* * * * *